US008232581B2

(12) United States Patent
Pourtois et al.

(10) Patent No.: US 8,232,581 B2
(45) Date of Patent: Jul. 31, 2012

(54) METHOD FOR MANUFACTURING AN III-V ENGINEERED SUBSTRATE AND THE III-V ENGINEERED SUBSTRATE THEREOF

(75) Inventors: Geoffrey Pourtois, Villers-la-Ville (BE); Clement Merckling, Schaerbeek (BE); Guy Brammertz, Eupen (BE); Matty Caymax, Leuven (BE)

(73) Assignee: IMEC, Leuven (BE)

( * ) Notice: Subject to any disclaimer, the term of this patent is extended or adjusted under 35 U.S.C. 154(b) by 253 days.

(21) Appl. No.: 12/822,944

(22) Filed: Jun. 24, 2010

(65) Prior Publication Data

US 2010/0327316 A1 Dec. 30, 2010

Related U.S. Application Data

(60) Provisional application No. 61/221,324, filed on Jun. 29, 2009.

(51) Int. Cl.
*H01L 29/20* (2006.01)
*H01L 21/203* (2006.01)

(52) U.S. Cl. . 257/190; 257/615; 257/616; 257/E29.089; 257/E21.09; 438/478; 438/933; 438/938

(58) Field of Classification Search ............. 257/190, 257/615, 616, E29.089, E21.09; 438/478, 438/933, 938
See application file for complete search history.

(56) References Cited

U.S. PATENT DOCUMENTS

| 5,997,638 | A  | * | 12/1999 | Copel et al. ............. 117/89 |
| 7,960,798 | B2 | * | 6/2011  | Luo et al. ............. 257/396 |
| 8,017,509 | B2 | * | 9/2011  | Lieten et al. ............. 438/509 |
| 2006/0046507 | A1 | * | 3/2006 | Tweet ............. 438/758 |
| 2008/0001139 | A1 | * | 1/2008 | Augusto ............. 257/13 |
| 2011/0089520 | A1 | * | 4/2011 | Lieten et al. ............. 257/472 |

OTHER PUBLICATIONS

De Souza, J.P. et al., "Inversion Mode n-Channel GaAs Field Effect Transistor with High-k/Metal Gate", Applied Physics Letters, vol. 92, (2008), pp. 153508-1-153508-2.
Pickett, Warren E. et al., "Ge—GaAs (110) Interface: A Self-Consistent Calculation of Interface States and Electronic Structure", Physical Review Letters, vol. 39, No. 2, Jul. 11, 1977, pp. 109-112.
Huang, L.J. et al., "Interfacial Properties of Metal-Insulator-Semiconductor Capacitors on GaAs (110)", J. Vac. Sci. Technol. A, 13(3), May/Jun. 1995, pp. 792-796.
Huang, L.J. et al., Metal-Insulator-Semiconductor Capacitors on Cleaved GaAs (110), J. Appl. Phys., vol. 76, No. 12, Dec. 15, 1994, pp. 8192-8194.

* cited by examiner

*Primary Examiner* — Victor A Mandala
(74) *Attorney, Agent, or Firm* — McDonnell Boehnen Hulbert & Berghoff LLP

(57) ABSTRACT

Manufacturing an III-V engineered substrate involves providing a base substrate comprising an upper layer made of a first III-V compound with a <110> or a <111> crystal orientation, forming an intermediate layer comprising at least a buffer layer of a second III-V compound, wherein the intermediate layer is overlying and in contact with the upper layer of the base substrate. Then a pseudomorphic passivation layer made of a group IV semiconductor material is grown so as to be overlying and in contact with the intermediate layer. This can enable an unpinned interface. The substrate surface can be smoother, implying fewer problems from surface stress. It can be used in electronic devices such as metal-oxide-semiconductor field effect transistors (MOSFETs), high electron mobility transistors (HEMTs), tunneling field effect transistors (TFETs), and optoelectronic devices.

20 Claims, 10 Drawing Sheets

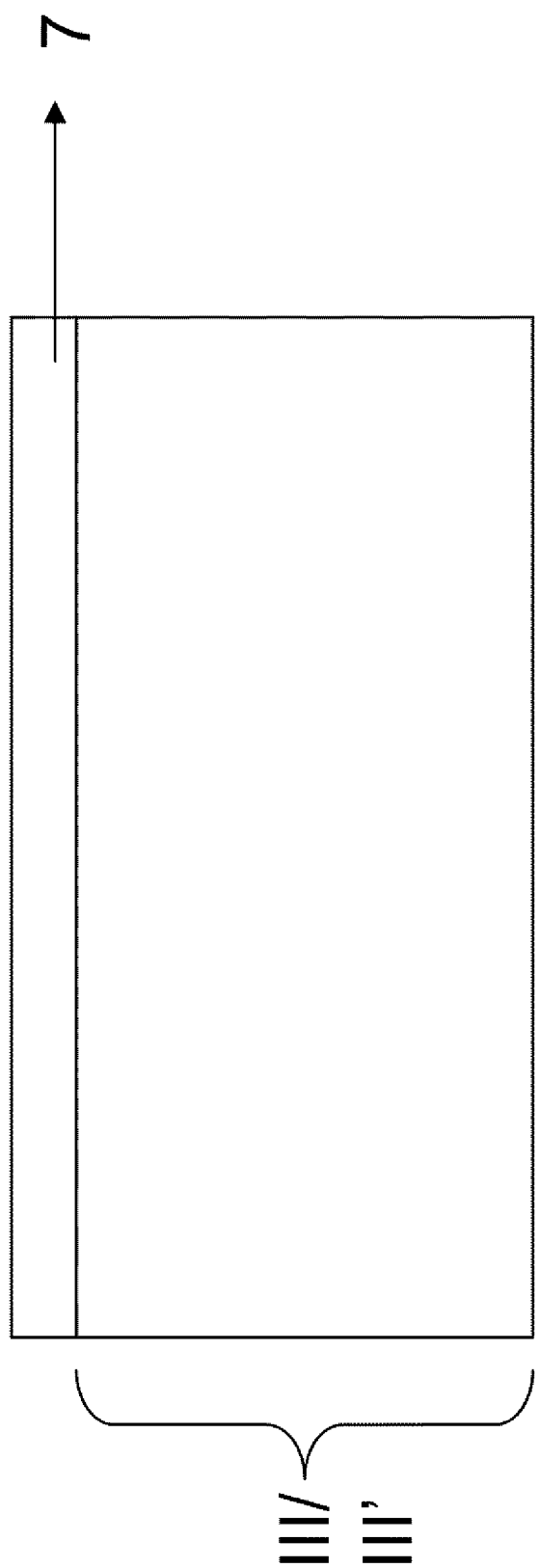

METHOD FOR MANUFACTURING AN III-V ENGINEERED SUBSTRATE AND THE III-V ENGINEERED SUBSTRATE THEREOF

CROSS-REFERENCE TO RELATED APPLICATIONS

The present application claims priority to U.S. Provisional Application No. 61/221,324 filed in the United States Patent and Trademark Office on Jun. 29, 2009, the entire contents of which is incorporated herein by reference.

BACKGROUND

The rapid scaling of complementary metal-oxide semiconductor (CMOS) devices to ever smaller dimensions is currently leading the microelectronic industry to introduce major changes in the design of transistors.

Among them is the replacement of the $SiO_2$ insulating layer with gate oxides having a higher dielectric constant and the introduction of metal electrodes, which introduce challenging issues. To meet the requirements of the next technological nodes, the silicon channel will soon have to be replaced by an alternative semiconductor.

Due to their high electron mobility, III-V compounds such as GaAs, InGaAs and InAs are ideal candidates to replace Si as the active material in the transistor channel.

However, an effective electrical passivation of the III-V materials remains an unsolved problem which prevents the development of functional MOS devices. In fact, the III-V/oxide interfaces are affected by a high density of defect states in the band gap which pin the Fermi level and are responsible for the poor electrical performances of the device. Various surface treatments such as surface passivation using sulfur compounds and surface cleaning using hydrogen or nitrogen plasma have been applied to reduce surface Fermi level pinning.

Patent application U.S. Pat. No. 6,159,834A discloses growing a $GaGdO_x$ oxide epitaxially on top of an III-V substrate. The $GaGdO_x$ oxide stabilizes the surface reconstruction of the III-V substrate, which minimizes the interface stress and leads to an unpinned Fermi level. However, the method limits the integration options to the use of the specific $GaGdO_x$ which can show significant leakage.

An alternative method described by De Souza et al. in Appl. Phys. Letters 92 153508 (2008) consists of depositing an amorphous layer of silicon on top of an III-V substrate (GaAs). However, this approach does not control the stress induced in the substrate and the electron-counting that governs the Fermi level pinning at the interface.

Therefore it is desirable to find a method that will effectively passivate an III-V substrate and will lead to a device with improved performance.

SUMMARY

A first aspect of the disclosure provides a method including forming an intermediate layer comprising forming at least a buffer layer made of a second III-V compound, wherein the intermediate layer is overlying and in contact with an upper layer of a base substrate, the upper layer made of a first III-V compound with a <110> or a <111> crystal orientation, and forming a pseudomorphic passivation layer made of a group IV semiconductor material, wherein the pseudomorphic passivation layer is overlying and in contact with the intermediate layer.

Another aspect provides a base substrate comprising an upper layer made of a first III-V compound with a <110> or a <111> crystal orientation, an intermediate layer comprising at least a buffer layer made of a second III-V compound, wherein the intermediate layer is overlying and in contact with the upper layer of the base substrate and, thereupon, and a pseudomorphic passivation layer made of a group IV semiconductor material, wherein the pseudomorphic passivation layer is overlying and in contact with the intermediate layer.

Another aspect provides a method of manufacturing a metal-oxide-semiconductor field effect transistor (MOSFET) comprising forming an intermediate layer comprising forming at least a buffer layer made of a second III-V compound, wherein the intermediate layer is overlying and in contact with an upper layer of a base substrate, the upper layer made of a first III-V compound with a <110> or a <111> crystal orientation, forming a pseudomorphic passivation layer made of a group IV semiconductor material, wherein the pseudomorphic passivation layer is overlying and in contact with the intermediate layer, and forming a MOSFET transistor in or over the pseudomorphic passivation layer.

Another aspect provides a method of manufacturing a high electron mobility transistor (HEMT) comprising forming an intermediate layer comprising forming at least a buffer layer made of a second III-V compound, wherein the intermediate layer is overlying and in contact with an upper layer of a base substrate, the upper layer made of a first III-V compound with a <110> or a <111> crystal orientation, forming a pseudomorphic passivation layer made of a group IV semiconductor material, wherein the pseudomorphic passivation layer is overlying and in contact with the intermediate layer, and forming a HEMT transistor in or over the pseudomorphic passivation layer.

Any additional features can be added to any of the aspects, and some such additional features are described and set out in dependent claims. Any combination of these features can be added, and any one or combination of them can be disclaimed, as would be apparent to those skilled in the art. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

FIG. 8 represents a dielectric layer (7) overlying the engineered substrate of the disclosure (III, III').

DETAILED DESCRIPTION

Figure 1A:
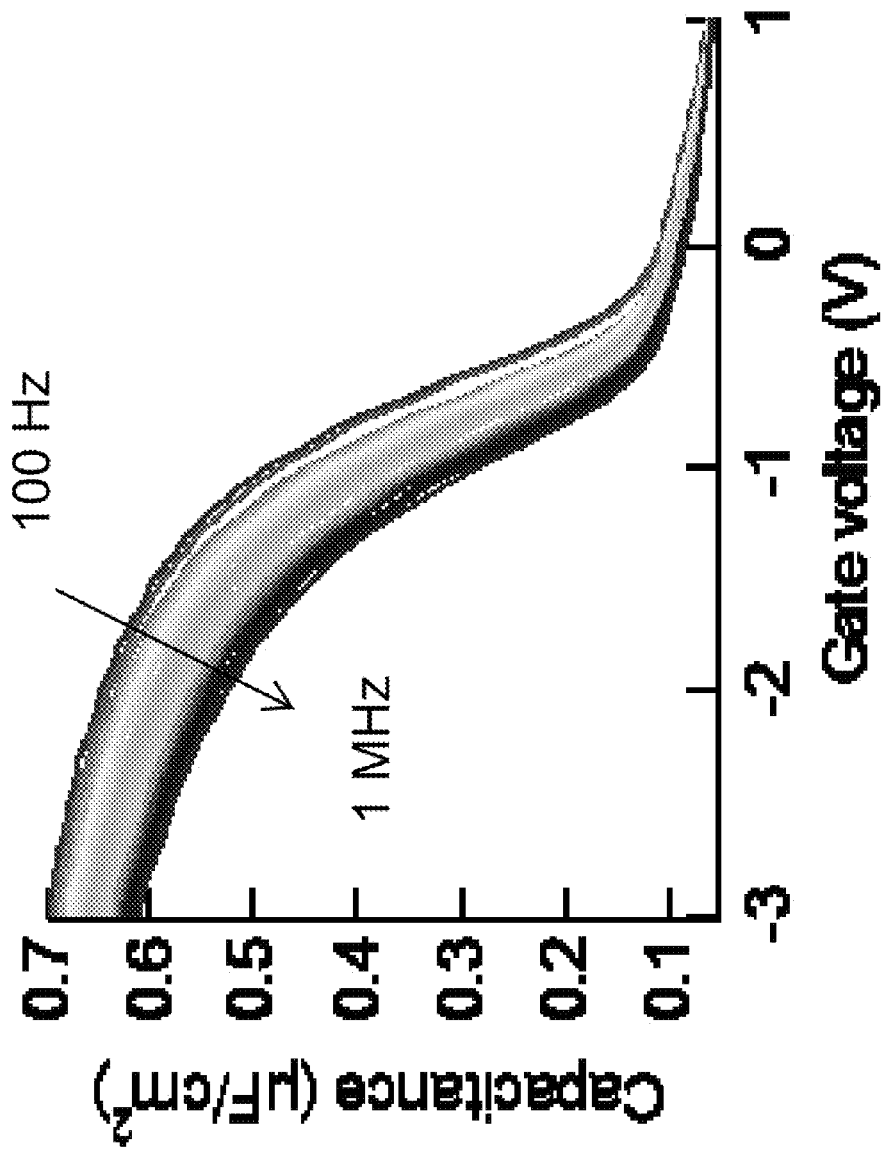
FIG. 1(a) represents the CV measurements at 25° C. for a capacitor structure defined on a p-GaAs(001) substrate with an $Al_2O_3$ dielectric layer and a Pt electrode.

The present invention will be described with respect to particular embodiments and with reference to certain drawings but the invention is not limited thereto, but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising," used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Different embodiments of the present disclosure set forth methods for manufacturing an III-V engineered substrate and the III-V engineered substrates thereof.

It is an aim of the present disclosure to set forth a method for manufacturing an III-V engineered substrate that can be used to produce advanced electronic devices such as metal-oxide-semiconductor field effect transistors (MOSFETs), high electron mobility transistors (HEMTs), tunneling field effect transistors (TFETs), optoelectronic devices, or other devices with various applications.

It is another aim of the present disclosure to set forth an III-V engineered substrate showing an effective electrical passivation of the oxide-engineered substrate interface. The III-V engineered substrate can be used to produce devices with superior performance.

The III-V/oxide interfaces are affected by a high density of defect states in the band gap which pin the Fermi level and are responsible for the poor electrical performances of the device.

Figure 1B:
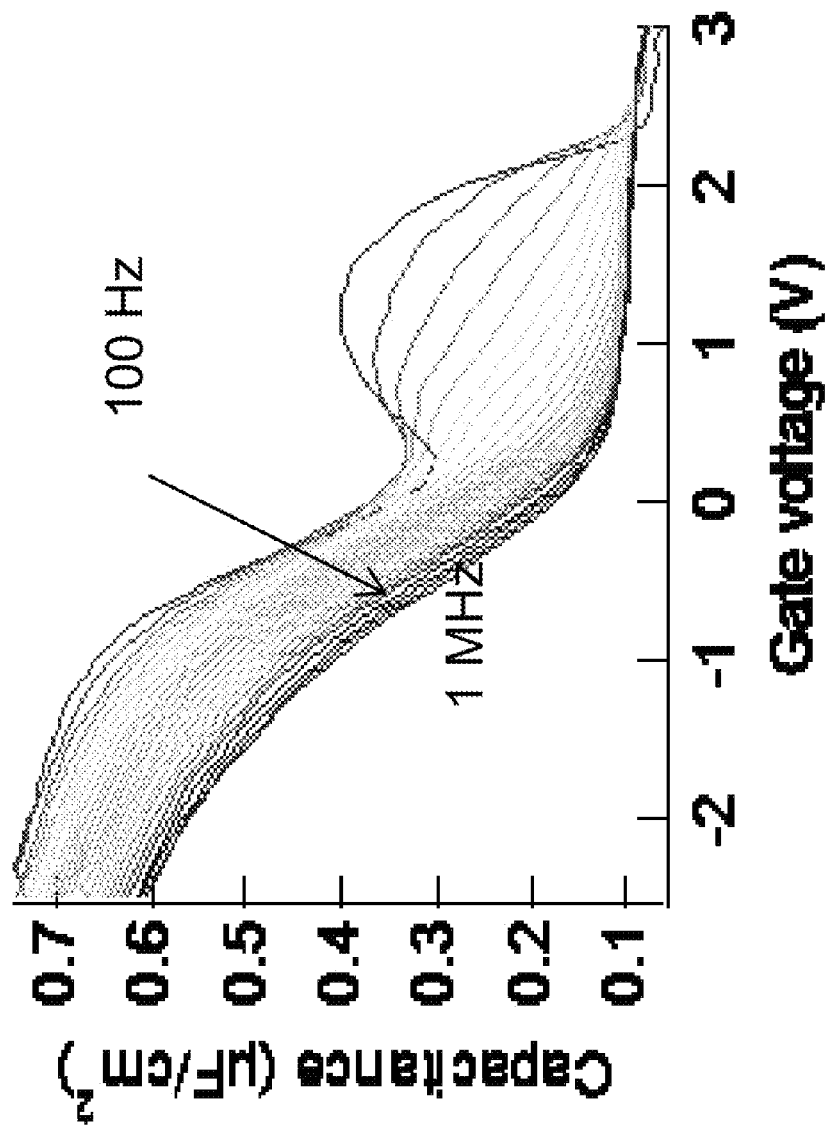
FIG. 1(b) represents the CV measurements at 150° C. for a capacitor structure defined on a p-GaAs(001) substrate with an $Al_2O_3$ dielectric layer and a Pt electrode.

This is illustrated by the CV measurements presented in FIGS. 1(a) and 1(b) for an $Al_2O_3$ dielectric layer deposited on a p-GaAs(001) substrate. Although the results at room temperature show a rather low frequency dispersion (FIG. 1(a)), a high frequency dispersion is measured at 150° C. (FIG. 1(b)), confirming the presence of defects in the mid-gap.

A part of the problem may originate in the stress accumulated in the underlying III-V layer during the deposition of the dielectric. During the dielectric film growth a set of interface defects are generated that pins the Fermi level of the substrate.

Compound semiconductors such as GaAs and InP have a crystal structure that is similar to that of diamond. However, the lattice contains two different types of atoms. Each atom has four covalent bonds with atoms of the other type. This structure is referred to as the zinc-blende lattice, named after zinc-blende crystal (ZnS).

Although GaAs has an inter-atomic bonding that is strongly covalent, there is a small amount of electron charge transfer from the gallium atoms to the arsenic ones and so the material can be considered very slightly ionic. Indeed, each Ga and As atom has three and five valence electrons, respectively. As a consequence, each Ga site contributes with 0.75 electron per bond created with an arsenic one, while a As atom provides 1.25 electron per bond with a Ga one. As a result, the electron charge transferred during the creation of a Ga—As bond is integer and the bond is covalent.

Figure 2:
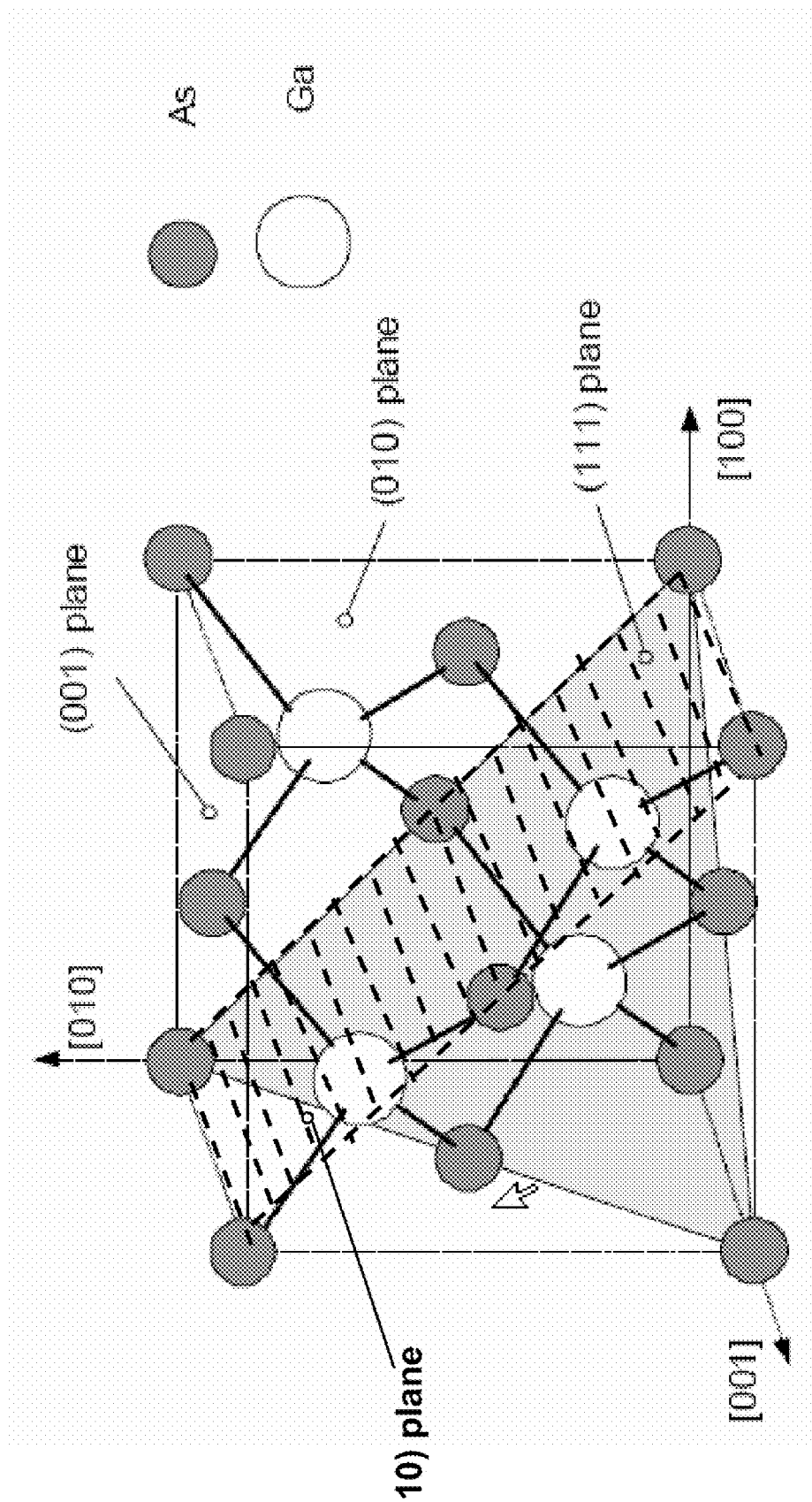
FIG. 2 represents the GaAs unit cell whereupon the different crystallographic directions and crystallographic planes are indicated.

FIG. 2 represents schematically the crystallographic unit cell of GaAs and the main crystallographic directions and planes. Gallium atoms are indicated by open circles, As atoms are indicated by full circles.

GaAs(001) is the starting surface for producing the majority of electronic devices worldwide. In experimental growth conditions different reconstructions of this surface have been reported as a function of stoichiometry.

Figure 3B:
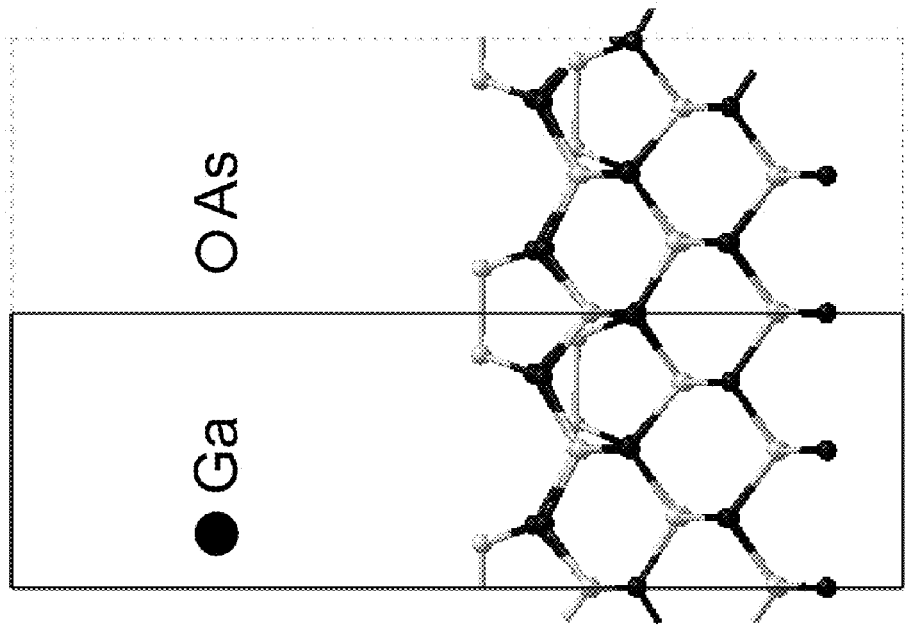
FIG. 3(b) represents a cross view of a GaAs(001) reconstructed surface.
Figure 3A:
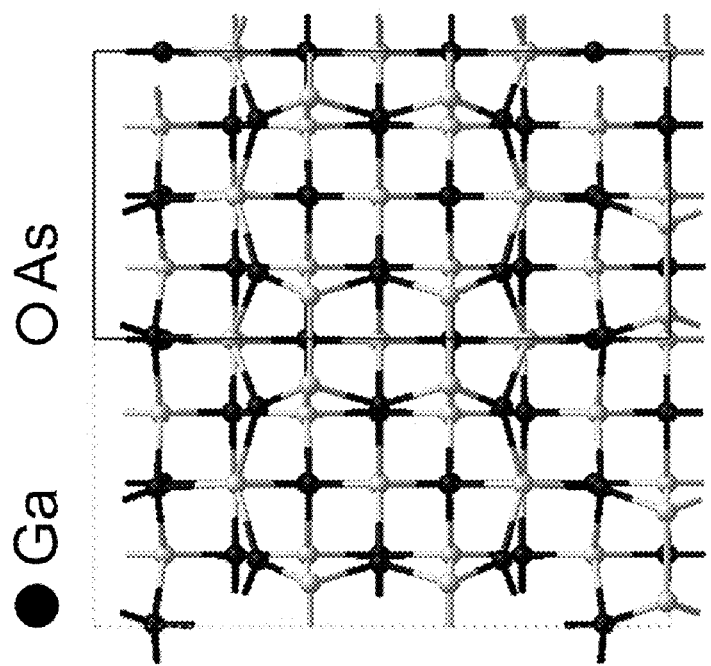
FIG. 3(a) shows a top view of a GaAs(001) reconstructed surface.

The lowest energy reconstruction and therefore the most likely structure for the As-terminated surface is the β(2×4) reconstruction shown in FIG. 3(a) (top view) and FIG. 3(b) (cross view). Because the periodicity of the surface has doubled (compared to the bulk periodicity) in the direction parallel to the trenches, and quadrupled in the direction perpendicular to the trenches, this is known as a (2×4) reconstruction.

Figure 3C:
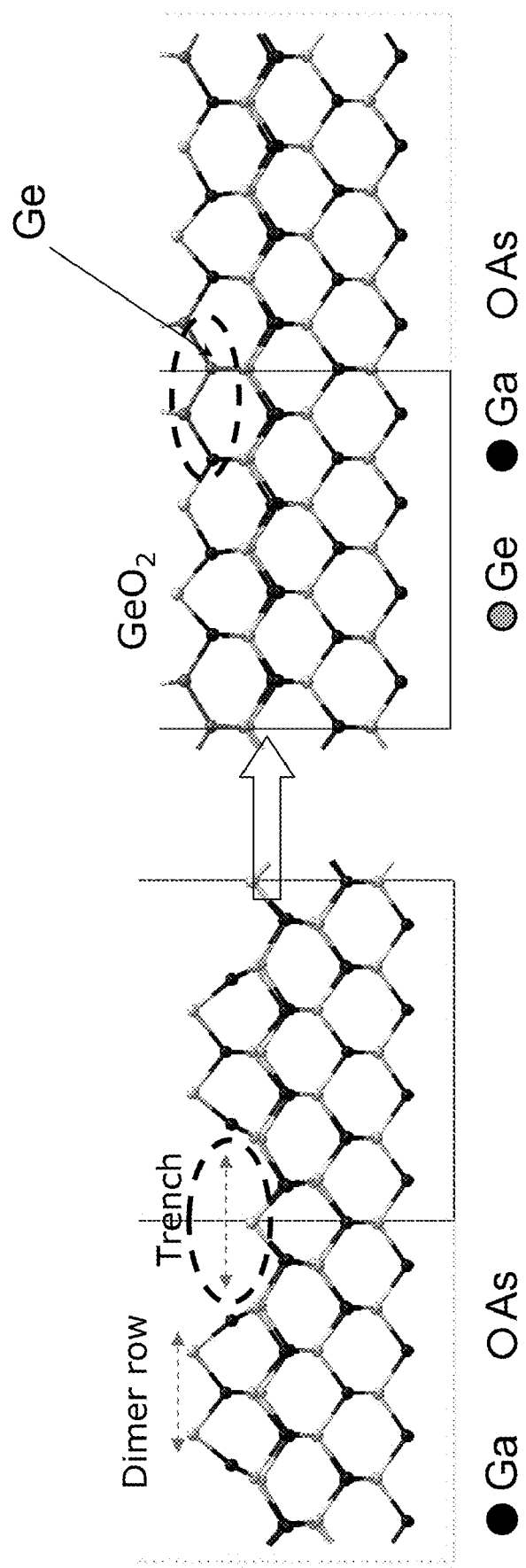
FIG. 3(c) shows a cross view of a GaAs(001) reconstructed surface, indicating the presence of As-dimers and trenches (left side) and of a germanium layer grown epitaxially on the GaAs(001) surface followed by oxidation of germanium to $GeO_2$ (right side).

The main features of the β(2×4) GaAs(001) reconstructed surface are the parallel rows of trenches, separated by blocks made up of top-layer As dimers sitting on second-layer Ga atoms. The As dimers and the trenches are also indicated in FIG. 3(c) (left side).

Germanium is in principle a suitable material for GaAs passivation because the lattice parameters of Ge and GaAs show a perfect match (both Ge and GaAs having a lattice constant of 5.65 Angstroms [$10^{-10}$ m]). However, growing a thin germanium layer on an e.g. β(2×4) GaAs(001) surface pins the Fermi level due to the electron counting mismatch that occurs between Ge and GaAs.

Indeed, since Ge has four valence electrons (and four bonds), it shares its valence shell by providing one electron per bond formed. As a result, the formation of a Ge(1|e|)-As (1.25|e|) bond leads to an excess of 0.25|e|, leading into a shift of the Fermi level in the conduction band, equivalent with a "n-type" doping behavior. A Ge|1|-Ga(0.75|e|) bond results in a shift of the Fermi level in the valence band, equivalent to a "p-type" doping behavior.

A controlled oxidation of the germanium layer grown on a GaAs(001) surface should reduce the interface state density. However, due to the presence of un-oxidized Ge in the β(2×4) GaAs(001) trenches as shown in FIG. 3(c) (right side), the Fermi level remains pinned.

Various embodiments of the disclosure set forth growing epitaxially a group IV element semiconductor material such as Ge or Si on top of a III-V substrate having a <110> or a <111> crystal orientation or any other crystal orientation that would lead to an alternating (even) distribution of group III and group V elements on the top surface of a III-V substrate, whereby the group IV element passivates the III-V substrate.

Examples of crystallographic planes with an alternating (even) distribution of group III and group V elements are the planes (110) (dotted lines, FIG. 2), (111) (grey background, FIG. 2) and all their crystallographic equivalent planes such as (-1-10), (220), (011), (0-1-1), (-1-1-1), (222), etc. A crystallographic equivalent plane is a plane that can be obtained by a symmetry transformation, depending upon the arbitrary choice of the orientation axes. Throughout the description, a crystallographic plane and all its equivalent planes are denoted by < > brackets and referred to as e.g. <110> or <111> crystal orientation.

By contrast, an un-even distribution has a top surface consisting exclusively of either group III elements (e.g. Ga, Ga-rich surfaces) or of group V elements (e.g. As, As-rich surfaces). Examples of un-even distributions are the crystallographic planes (001), (010) and (100) which are the faces of the cubic structure shown in FIG. 2 and all their crystallographic equivalent planes such as (00-1), (0-10) or (-100).

Figure 4C:
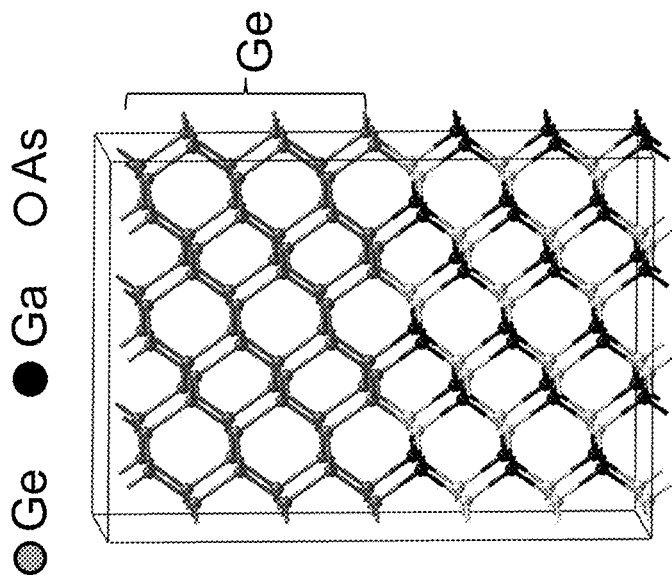
FIG. 4(c) shows a Ge(110) passivation layer grown epitaxially on a GaAs(110) surface.
Figure 4A:
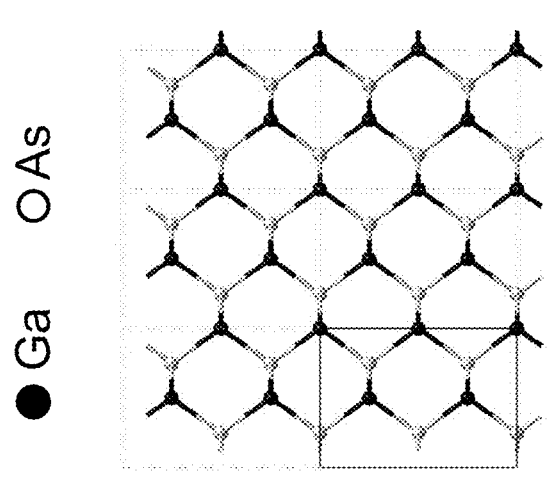
FIG. 4(a) shows a top view of a GaAs(110) surface.
Figure 4B:
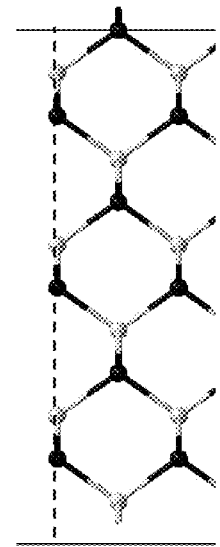
FIG. 4(b) shows a cross view of a GaAs(110) surface.

FIGS. 4(a) and 4(b) represent schematically the top view and, respectively, the cross view of a GaAs(110) surface. GaAs(110) is a stable surface with an even (alternating) distribution of group III and group V elements, which does not show reconstruction.

By selecting an III-V substrate with a <110> or a <111> crystal orientation as in the present disclosure, several advantages are present.

First, the mismatch in electron counting does not exist for the <110> and <111> crystal orientations underlying a passivation layer made of a group IV element. The alternating distribution of group III elements and group V elements at the top surface of the substrate balances the electron counting mismatch with the group IV element, leading therefore to an unpinned interface.

FIG. 4(c) shows a Ge <110> layer grown epitaxially on a GaAs <110> substrate. An even number of Ga and As atoms at the top surface makes the surface 'neutral' from the electron counting point of view.

Secondly, the surface of the III-V substrate with a <110> or a <111> crystal orientation is smoother, which implies a better control of the surface stress during subsequent dielectric film (oxide) deposition.

Figure 6:
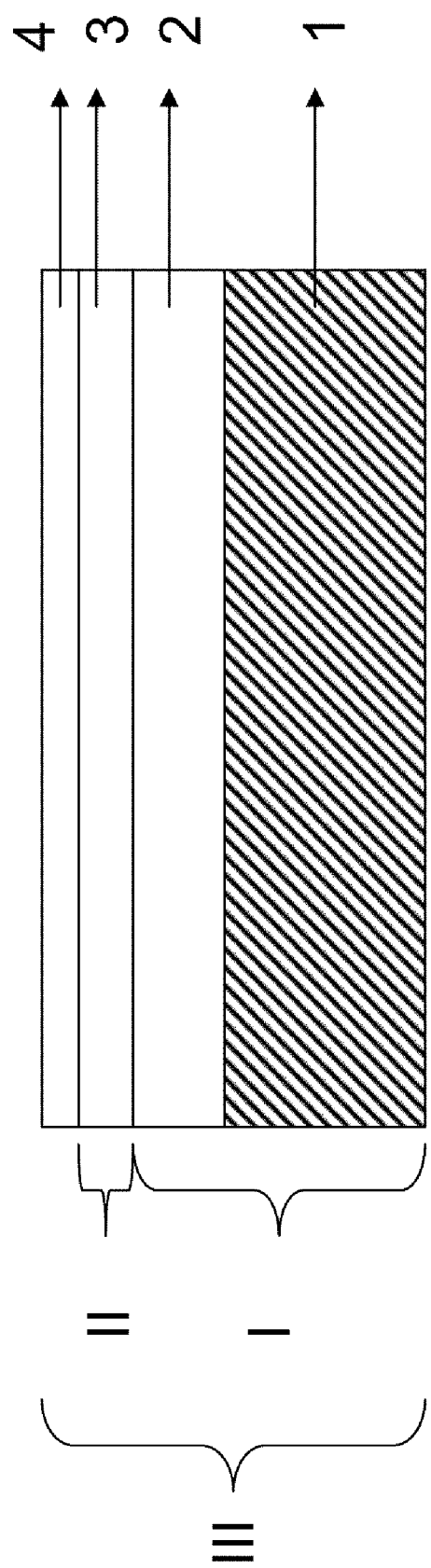
FIG. 6 represents schematically an engineered substrate of the disclosure (III).

In a first aspect of the present disclosure a method for manufacturing an engineered substrate III, III' is disclosed, comprising:
 providing a base substrate I (See FIG. 6) comprising an upper layer 2 made of a first III-V compound having a <110> or a <111> crystal orientation,
 forming an intermediate layer II, II' comprising forming at least a buffer layer 3 made of a second III-V compound, wherein the intermediate layer II, II' is overlying and in contact with the upper layer 2 of the base substrate I and, thereafter,
 growing a pseudomorphic passivation layer 4 made of a group IV semiconductor material, wherein the pseudomorphic passivation layer is overlying and in contact with the intermediate layer II, II'.

According to the method of the disclosure the passivation layer is a thin epitaxial film of a group IV element having a thickness of a few monolayers. The layer is pseudomorphic, which means it is lattice matched with the immediately underlying layer/substrate and it has a thickness below a critical thickness. The passivation layer is thick enough to prevent oxygen diffusion towards the III-V underlying layers during the subsequent process step of forming a dielectric layer.

The strain required to form a lattice-matched layer (e.g. a passivation layer on a substrate) results from the need to elastically "stretch" or "compress" that layer relative to the lattice constant of the substrate. This strain, however, limits the thickness of a lattice-matched layer. The strain increases as the lattice-matched layer grows thicker. At a "critical thickness," the strain energy is too important, and defects are created, breaking the lattice matching.

Advantageously, the embodiment further comprises at least a partial oxidation of the passivation layer and, thereafter, at least a partial etching of the oxide formed, in a subsequent process step. The result is a passivated substrate (i.e., an engineered substrate) having atop a group IV element-oxide layer, compatible with current CMOS technologies, which allows further standard integration.

In a subsequent process step, on top of the passivated/engineered substrate, a layer of a dielectric material is formed by e.g. atomic layer deposition (ALD), chemical vapor deposition (CVD), or molecular beam epitaxy (MBE). The dielectric material can be a high-k dielectric material, having a dielectric constant k higher than that of $SiO_2$ ($k_{SiO2}$~4.2) and can function as a gate dielectric in a transistor structure.

In embodiments wherein the engineered substrate of the disclosure is used to manufacture a field effect transistor (FET), the positioning of the valence band and of the conduction band of the group IV element of the passivation layer with respect to the electronic band gap of the III-V compound of the immediately underlying layer at least partly determines the good working of the device. This positioning will be further referred to as band gap alignment at the interface.

The current disclosure describes further controlling the band gap alignment at the passivated interface by selecting an appropriate thickness of the passivation layer and/or by modifying the composition of the buffer layer underlying the passivation layer.

In case of a thin epitaxial layer made of Si on a Ge substrate, the position of the silicon conduction and valence bands is influenced by the thickness of the Si layer. More specifically, the Si conduction band is gradually shifted in the Ge band gap with the increasing Si film thickness and converges to its bulk value for 10 monolayers of Si.

Analogously, in the case of a passivation layer made of a group IV element on a substrate made of a III-V compound, the conduction band of the group IV element will be gradually shifted in the III-V compound band gap as a function of the passivation layer thickness.

The embodiment discloses selecting an optimum thickness for the pseudomorphic passivation layer made of a group IV element taking into account the shift of the conduction band with the layer thickness.

Various embodiments of the disclosure set forth forming a pseudomorphic group IV passivation layer 4 overlying and in contact with a buffer layer 3 made of a second III-V compound, wherein the buffer layer is formed upon a III-V base substrate I having an upper layer 2 made of the first III-V compound with a <111> or a <110> crystal orientation. The buffer layer 3 can be formed alternatively by modifying an upper layer 2 of the III-V base substrate I, e.g. by modifying the first III-V compound having a <111> or a <110> crystal orientation to obtain a second III-V compound having the same crystal orientation.

The buffer layer made of the second III-V compound is grown epitaxially on the base substrate I having an upper layer 2 made of a first III-V compound with a <111> or a <110> crystal orientation. Therefore the second III-V compound will have also a <111> or a <110> crystal orientation.

In different embodiments of the disclosure the buffer layer 3 overlying the base substrate I can function as a channel of a field effect transistor (FET). In these embodiments, the second III-V compound is selected such that its band gap is not overlapping with one of the conduction and valence bands of the group IV element. The second III-V compound is selected such that its band gap is free from the electronic states of the group IV element in the passivation layer, since both the conduction and the valence band of the group IV element lie outside the band gap of the second III-V compound.

In particular embodiments of the first aspect the second III-V compound is InGaAs. A layer of InGaAs is overlying a base substrate I having an upper layer made of GaAs with <110> or <111> crystal orientation. The layer of InGaAs is underlying a Ge passivation layer. InGaAs will have the same crystal orientation as the underlying GaAs layer.

Figures 5A, 5B:
FIG. 5(a) represents schematically the band alignment at the interface between GaAs and Ge.
FIG. 5(b) represents schematically the band alignment at the interface between $In_{0.5}Ga_{0.5}As$ and Ge.

FIG. 5(b) shows the band alignment of InGaAs and Ge compared to the band alignment of GaAs and Ge shown in FIG. 5(a).

The passivation layer 4 is lattice matched with the immediate underlying layer which is the intermediate layer II, II'. In the embodiments wherein the intermediate layer consists of a buffer layer 3 made of a second III-V compound material, the passivation layer 4 is lattice matched with the second III-V compound material.

Embodiments of the first aspect disclose a method wherein the second III-V compound is selected to have an electronic band gap that is not overlapping with one of the conduction band or the valence band of the group IV semiconductor material. Advantageously, the buffer layer made of the second III-V compound is suitable to function as a channel layer in a field effect transistor (FET).

In specific embodiments the second III-V compound material can have the same chemical composition as the first III-V compound material.

Figure 7:
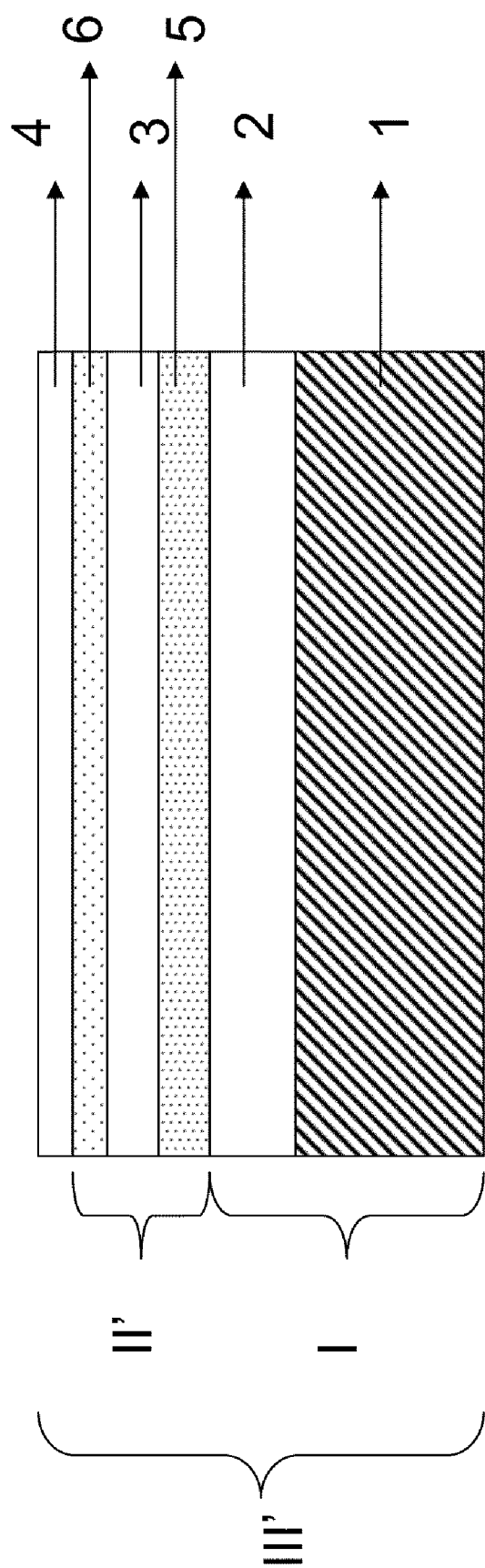
FIG. 7 represents schematically an alternative engineered substrate of the disclosure (III').

Different embodiments of the first aspect disclose a method wherein forming the intermediate layer II' further comprises:
  forming an additional buffer layer 5 (See FIG. 7) made of a third III-V compound overlying and in contact with the upper layer 2 of the base substrate I and underlying and in contact with the buffer layer 3, and
  forming a barrier layer 6 made of a fourth III-V compound overlying and in contact with the buffer layer 3 and underlying and in contact with the pseudomorphic passivation layer 4.

Alternatively, the buffer layer 3 made of the second III-V compound is suitable to function as a channel layer in a high electron mobility transistor (HEMT). Further in the same embodiments, the additional buffer layer 5 made of a third III-V compound is suitable to function as a buffer layer of a HEMT, and the barrier layer 6 made of a fourth III-V compound is suitable to function as a barrier layer of a HEMT. In the embodiments wherein the intermediate layer II' comprises multiple layers, the upper one being a barrier layer 6 made of a fourth III-V compound material, the passivation layer 4 is in contact and lattice matched with the fourth III-V compound material.

In various embodiments, the second III-V compound, the third III-V compound, and the fourth III-V compound are epitaxially grown using chemical vapor deposition (CVD), metal-organic chemical vapor deposition (MOCVD), or a ultra-high vacuum technique (UHV) such as molecular beam epitaxy (MBE).

In some embodiments of the disclosure, at least one of the first III-V compound, the second III-V compound, the third III-V compound or the fourth III-V compound comprises dopants.

In specific embodiments, the third III-V compound and the fourth III-V compound can have the same chemical composition.

Typically Si is used as dopant to form an n-type III-V semiconductor material and Be is used as dopant to form a p-type III-V semiconductor material.

Various embodiments disclose a group IV semiconductor material selected from the group consisting of Si, Ge, Sn and mixtures thereof. The pseudomorphic group IV element layer is grown epitaxially by chemical vapor deposition (CVD), or an ultra-high vacuum (UHV) deposition technique such as molecular beam epitaxy (MBE).

Preferably, the group IV semiconductor material is crystalline Ge having a good crystal quality. In a particular embodiment the pseudomorphic Ge layer is grown epitaxially by molecular beam epitaxy in an ultra high vacuum (UHV) chamber at a growth temperature between 300° C. and 350° C. and with a growth rate of approximately 0.3 nm/min.

Various embodiments of the disclosure set forth a first III-V compound comprising at least a group III element selected from the group consisting of Ga, In, Al and a group V element selected from the group consisting of P, As, and Sb.

Different embodiments of the disclosure set forth a second III-V compound comprising GaAs. More preferably, the second III-V compound comprises $In_xGa_{(1-x)}As$, with $0<x<1$.

Embodiments of the disclosure set forth a third III-V compound that comprises $In_xAl_{(1-x)}As$, with $0<x<1$.

Different embodiments of the disclosure set forth a fourth III-V compound that comprises $In_xAl_{(1-x)}As$, with $0<x<1$.

The base substrate I comprises a substrate 1 made of a semiconductor material or a stack of semiconductor materials such as Si, Ge or combinations thereof. Alternatively, the substrate can comprise silicon on insulator (SOI), germanium on insulator (GOI), quartz, glass, or other materials compatible with microelectronic device fabrication.

The method of the disclosure may further comprise forming a dielectric layer 7 overlying the engineered substrate of the disclosure III, III' as shown in FIG. 8. Forming said dielectric layer is preceded optionally by a partial oxidation step of the passivation layer 4. The dielectric layer 7 can be a high-k dielectric material, having a dielectric constant k higher than that of $SiO_2$ ($k_{SiO2}$~4.2). The high-k dielectric material can comprise $Al_2O_3$, $HfO_2$, $HfSiO_x$, $HfSiON$, $DyO_x$, $DyScO_x$, $ZrO_x$, or combinations thereof.

In a second aspect of the disclosure, an III-V engineered substrate III, III' for an electronic device is disclosed comprising:
  a base substrate I comprising an upper layer 2 made of a first III-V compound with a <110> or a <111> crystal orientation,
  an intermediate layer II, II' comprising at least a buffer layer 3 made of a second III-V compound, wherein the intermediate layer II, II' is overlying and in contact with the upper layer 2 of the base substrate and, thereupon,
  a pseudomorphic passivation layer 4 made of a group IV semiconductor material, wherein the pseudomorphic passivation layer is overlying and in contact with the intermediate layer II, II'.

In embodiments of the second aspect of the disclosure, the second III-V compound is selected to have an electronic band gap which is not overlapping with one of the conduction band or the valence band of the group IV semiconductor material.

Advantageously, the buffer layer made of the second III-V compound can function as a channel of a field effect transistor (FET).

In specific embodiments of the second aspect, the first III-V compound is InP, the second III-V compound is $In_xGa_{(1-x)}As$ with x>0.5 and the group IV semiconductor material is Ge.

Embodiments of the second aspect may further comprise:
an additional buffer layer 5 made of a third III-V compound overlying and in contact with the upper layer 2 of the base substrate I and underlying and in contact with the buffer layer 3, and
a barrier layer 6 made of a fourth III-V compound overlying and in contact with the buffer layer 3 and underlying and in contact with the pseudomorphic passivation layer 4.

Alternatively, the buffer layer 3 made of the second III-V compound functions as a channel layer of a high electron mobility transistor (HEMT). In these embodiments the additional buffer layer 5 made of a third III-V compound functions as a buffer layer of a HEMT and the barrier layer 6 made of a fourth III-V compound functions as a barrier layer of a HEMT.

In specific embodiments of the second aspect, the first III-V compound is InP, the second III-V compound is $In_xGa_{(1-x)}As$ with 0<x<1, the third and the fourth III-V compound is $In_xAl_{(1-x)}As$ with 0<x<1 and the group IV semiconductor material is Ge. The engineered substrate of the present disclosure can be used in different areas of the semiconductor device manufacturing. While the substrate is described in conjunction with GaAs, InGaAs, InAlAs and Ge, it will be apparent to those having ordinary skill in the art that the benefits of this disclosure can be applied to other semiconductor materials and/or substrates as described elsewhere in the text.

The method disclosed can be suitably applied for manufacturing of MOSFET devices, HEMT devices, TFET devices and optoelectronic devices such as laser diodes or any other devices that can use an III-V engineered substrate with improved performance.

Other variations can be envisaged within the scope of the claims.

The invention claimed is:

1. A method for manufacturing an III-V engineered substrate comprising:
    forming an intermediate layer comprising forming at least a buffer layer made of a second III-V compound, wherein the intermediate layer is overlying and in contact with an upper layer of a base substrate, the upper layer made of a first III-V compound with a <110> or a <111> crystal orientation, and
    forming a pseudomorphic passivation layer made of a group IV semiconductor material, wherein the pseudomorphic passivation layer is overlying and in contact with the intermediate layer.

2. The method of claim 1, wherein the second III-V compound is selected to have an electronic band gap that is not overlapping with one of the conduction band or the valence band of the group IV semiconductor material.

3. The method of claim 1, wherein forming the intermediate layer further comprises:
    forming an additional buffer layer made of a third III-V compound overlying and in contact with the upper layer of the base substrate and underlying and in contact with the buffer layer, and
    forming a barrier layer made of a fourth III-V compound overlying and in contact with the buffer layer and underlying and in contact with the pseudomorphic passivation layer.

4. The method of claim 3, wherein at least one of the first III-V compound, the second III-V compound, the third III-V compound, and the fourth III-V compound comprises dopants.

5. The method of claim 3, wherein the third III-V compound comprises $In_xAl_{(1-x)}As$, with 0<x<1.

6. The method of claim 3, wherein the fourth III-V compound comprises $In_xAl_{(1-x)}As$, with 0<x<1.

7. The method of claim 1, wherein the group IV semiconductor material is selected from the group consisting of Si, Ge, Sn and mixtures thereof.

8. The method of claim 1, wherein the first III-V compound comprises at least a group III element selected from the group consisting of Ga, In, Al, and a group V element selected from the group consisting of P, As, and Sb.

9. The method of claim 1, wherein the second III-V compound comprises GaAs.

10. The method of claim 1, wherein the second III-V compound comprises $In_xGa_{(1-x)}As$, with 0<x<1.

11. An III-V engineered substrate comprising:
    a base substrate comprising an upper layer made of a first III-V compound with a <110> or a <111> crystal orientation,
    an intermediate layer comprising at least a buffer layer made of a second III-V compound, wherein the intermediate layer is overlying and in contact with the upper layer of the base substrate, and
    a pseudomorphic passivation layer made of a group IV semiconductor material, wherein the pseudomorphic passivation layer is overlying and in contact with the intermediate layer.

12. The engineered substrate of claim 11, wherein the second III-V compound is selected to have an electronic band gap which is not overlapping with one of the conduction band or the valence band of the group IV semiconductor material.

13. The engineered substrate of claim 11, wherein the first III-V compound is InP, the second III-V compound is $In_xGa_{(1-x)}As$ with 0<x<1 and the group IV semiconductor material is Ge.

14. The engineered substrate of claim 11, further comprising:
    an additional buffer layer made of a third III-V compound overlying and in contact with the upper layer of the base substrate and underlying and in contact with the buffer layer, and
    a barrier layer made of a fourth III-V compound overlying and in contact with the buffer layer and underlying and in contact with the pseudomorphic passivation layer.

15. The engineered substrate of claim 14, wherein the first III-V compound is InP, the second III-V compound is $In_xGa_{(1-x)}As$ with 0<x<1, the third III-V compound is $In_xAl_{(1-x)}As$ with 0<x<1, the fourth III-V compound is $In_xAl_{(1-x)}As$ with 0<x<1, and the group IV semiconductor material is Ge.

16. A method of manufacturing a metal-oxide-semiconductor field effect transistor (MOSFET) device, comprising:
    forming an intermediate layer comprising forming at least a buffer layer made of a second III-V compound, wherein the intermediate layer is overlying and in contact with an upper layer of a base substrate, the upper layer made of a first III-V compound with a <110> or a <111> crystal orientation,
    forming a pseudomorphic passivation layer made of a group IV semiconductor material, wherein the pseudomorphic passivation layer is overlying and in contact with the intermediate layer, and forming a MOSFET transistor in or over the pseudomorphic passivation layer.

17. The method of claim 16, wherein the MOSFET transistor is formed at least partially in the pseudomorphic passivation layer and the buffer layer, and wherein the buffer layer functions as a channel of the MOSFET transistor.

18. A method of manufacturing a high electron mobility transistor (HEMT) device, comprising:
    forming an intermediate layer comprising forming at least a buffer layer made of a second III-V compound, wherein the intermediate layer is overlying and in contact with an upper layer of a base substrate, the upper layer made of a first III-V compound with a <110> or a <111> crystal orientation,
    forming a pseudomorphic passivation layer made of a group IV semiconductor material, wherein the pseudomorphic passivation layer is overlying and in contact with the intermediate layer, and
    forming a HEMT transistor in or over the pseudomorphic passivation layer.

19. The method of claim 18, wherein the HEMT transistor is formed at least partially in the pseudomorphic passivation layer and the buffer layer, and wherein the buffer layer functions as a channel of the HEMT transistor.

20. The method of claim 19, further comprising forming an additional buffer layer made of a third III-V compound overlying and in contact with the upper layer of the base substrate and underlying and in contact with the buffer layer,
    wherein the additional buffer layer functions as a buffer of the HEMT transistor.

* * * * *